United States Patent
Fields, Jr. et al.

(10) Patent No.: US 7,007,210 B2
(45) Date of Patent: Feb. 28, 2006

(54) METHOD AND SYSTEM FOR HANDLING MULTIPLE BIT ERRORS TO ENHANCE SYSTEM RELIABILITY

(75) Inventors: James Stephen Fields, Jr., Austin, TX (US); Alongkorn Kitamorn, Austin, TX (US); Wayne Lemmon, Rochester, MN (US); David Otto Lewis, Rochester, MN (US); Kevin F. Reick, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 731 days.

(21) Appl. No.: 10/059,608

(22) Filed: Jan. 30, 2002

(65) Prior Publication Data

US 2003/0145257 A1 Jul. 31, 2003

(51) Int. Cl.
  *G11C 29/00* (2006.01)
(52) U.S. Cl. ............... 714/718; 714/720; 714/723; 711/113; 711/118
(58) Field of Classification Search ............... 714/704, 714/718, 720, 723, 722, 710, 753, 746, 799; 711/118, 113
See application file for complete search history.

(56) References Cited

U.S. PATENT DOCUMENTS

| | | | | |
|---|---|---|---|---|
| 5,604,753 A | * | 2/1997 | Bauer et al. ............... | 714/763 |
| 5,629,950 A | * | 5/1997 | Godiwala et al. ........... | 714/805 |
| 5,666,513 A | * | 9/1997 | Whittaker .................... | 711/118 |
| 5,954,435 A | * | 9/1999 | Yoshida ....................... | 714/42 |
| 6,035,436 A | * | 3/2000 | Wu et al. .................... | 714/797 |
| 6,122,710 A | * | 9/2000 | Kumar et al. ............... | 711/118 |
| 6,292,906 B1 | * | 9/2001 | Fu et al. ....................... | 714/6 |
| 6,516,429 B1 | * | 2/2003 | Bossen et al. ................ | 714/47 |
| 6,560,733 B1 | * | 5/2003 | Ochoa ......................... | 714/723 |

OTHER PUBLICATIONS

Bossen et al., "POWER4 Systems: Design for Reliability", IBM Server Group Hot Chips 13 Conference, Aug. 2001, pp. 1-9.

* cited by examiner

*Primary Examiner*—Phung My Chung
(74) *Attorney, Agent, or Firm*—Duke W. Yee; Mark E. McBurney; Wing Yan Mok

(57) ABSTRACT

The present invention provides an improved method, an system, and a set of computer implemented instructions for handling a cache containing multiple single-bit hard errors on multiple addresses within a data processing system. Such handles will prevent any down time by logging in the parts to be replaced by an operator when certain level of bit errors is reached. When a hard error exists on a cache address for the first time, serviceable first hard error, that cache line is deleted. Thus the damaged memory device is no longer used by the system. As a result, the system is running with "N–x" lines wherein "N" constitutes the total number of existing lines and "x" is less than "N". An alternative method is to exchange the damaged memory device to a spare memory device. In order to provide such services, the system must first differentiate whether an error is a soft or hard error.

80 Claims, 3 Drawing Sheets

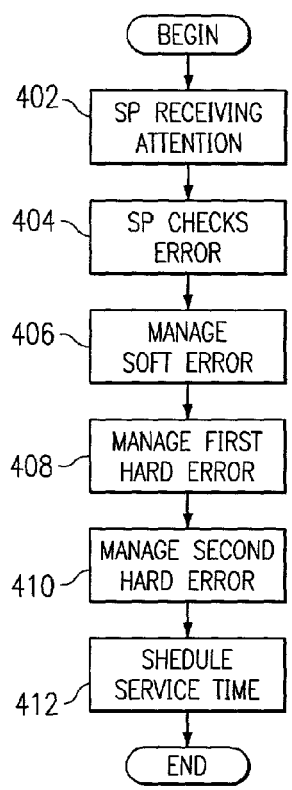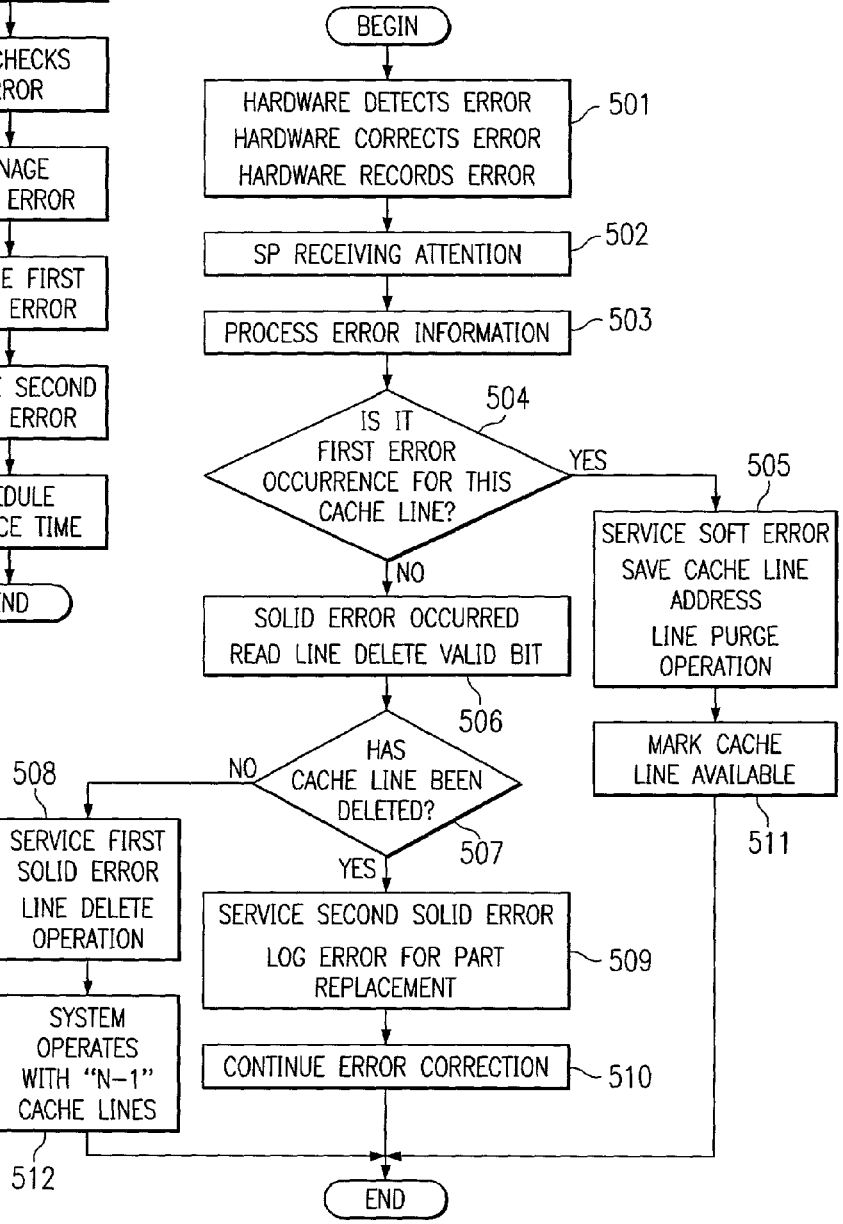

METHOD AND SYSTEM FOR HANDLING MULTIPLE BIT ERRORS TO ENHANCE SYSTEM RELIABILITY

BACKGROUND OF THE INVENTION

1. Technical Field

The present invention relates generally to an improved data processing system, and in particular to a method and apparatus for handling multiple bit errors in a data processing system. The present invention also provides a set of computer-implemented instruction for serving multiple bit errors.

2. Description of Related Art

In a large memory system, errors from memory device may cause a catastrophic system error. A hard error means that a cell within the memory device is permanently defective. On the other hand, a soft error is a temporary fault such as when a data bit is lost. With soft errors, the memory device still functions correctly after the data is rewritten into the memory cell. There are many causes of soft errors, such as alpha particles, noise on power or control signals, temperature extremes, marginal timing, or the like.

Today computer systems with high availability requirements use error detection logic and parity to ensure data integrity and system reliability. For computer hardware with high failure rates (e.g. system memory, cache, etc.), error correction code (ECC) logic is used to correct single bit error. Such ECC logic helps to prevent an immediate failure of the system and improve overall system availability.

A system memory is the central storage in the computer where program and data reside and waiting to be processed by the processor. A cache is a temporary storage area close to or internal to the processor that allows speedy access to program or data. An array is a term generally refer to as smaller arrangements of temporary memory storage, including cache. A cache or memory address is a reference to a physical location within the cache or memory storage which store one or several bytes of computer instruction or data. A cache line is a block of addresses or physical locations within the cache, usually a group of 128, 256 or 512 bytes of data. Such architecture of line addressing may also apply to any memory system.

A cache or memory address with repeating single bit errors indicates a hard error condition which requires continuous error correction by ECC logic. A cache or memory with a single hard error, if left in the system for an extended period of time, may lead to an incorrectable error condition and system outage due to an occurrence of second hard error within the same or adjacent physical address location. A typical ECC logic can only handle single bit error. To prevent potential system failure for a computer system with high availability requirement, it is a general practice to replace the cache or memory with single bit hard error. However, frequent replacement of parts can lead to high service cost for the computer manufacturer and poor system reliability perception by the customer.

Therefore, it would be advantageous to have an improved system to minimize service cost and to improve system reliability by having the capability to continuously run the system without replacing the part with single-bit hard error and even when a second hard error occurs. It would further be beneficial to have an apparatus and method that allows scheduling of maintenance time after a second hard error occurrence but before a catastrophic error or system down time.

SUMMARY OF THE INVENTION

The present invention provides a method and system for handling bit errors on a data processing system. The method first determines whether the bit error is a soft or hard error. The error correction code logic corrects and handles soft errors. When a hard error exists on a line for the first time on the system, the bit error is removed from the system. Specifically, a bit error is removed by deleting the line that correspond to the bit error and permanently damaged memory device, thereby the line is no longer used by the system. As a result, the system is running with "N−1" lines wherein "N" constitutes the total number of existing lines.

When multiple hard errors exist, the system will prevent any down time by logging in the parts to be replaced by an operator. The error correction code logic corrects the hard errors until that part is replaced.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 4 is a flowchart outlining a process for handling cache with multiple bit errors according to an embodiment of the present invention; and FIG. 5 is flowchart of a process for handling bit errors on a data processing system according to an embodiment of the present invention.

DETAILED DESCRIPTION OF THE PREFERRED EMBODIMENT

Figure 1:
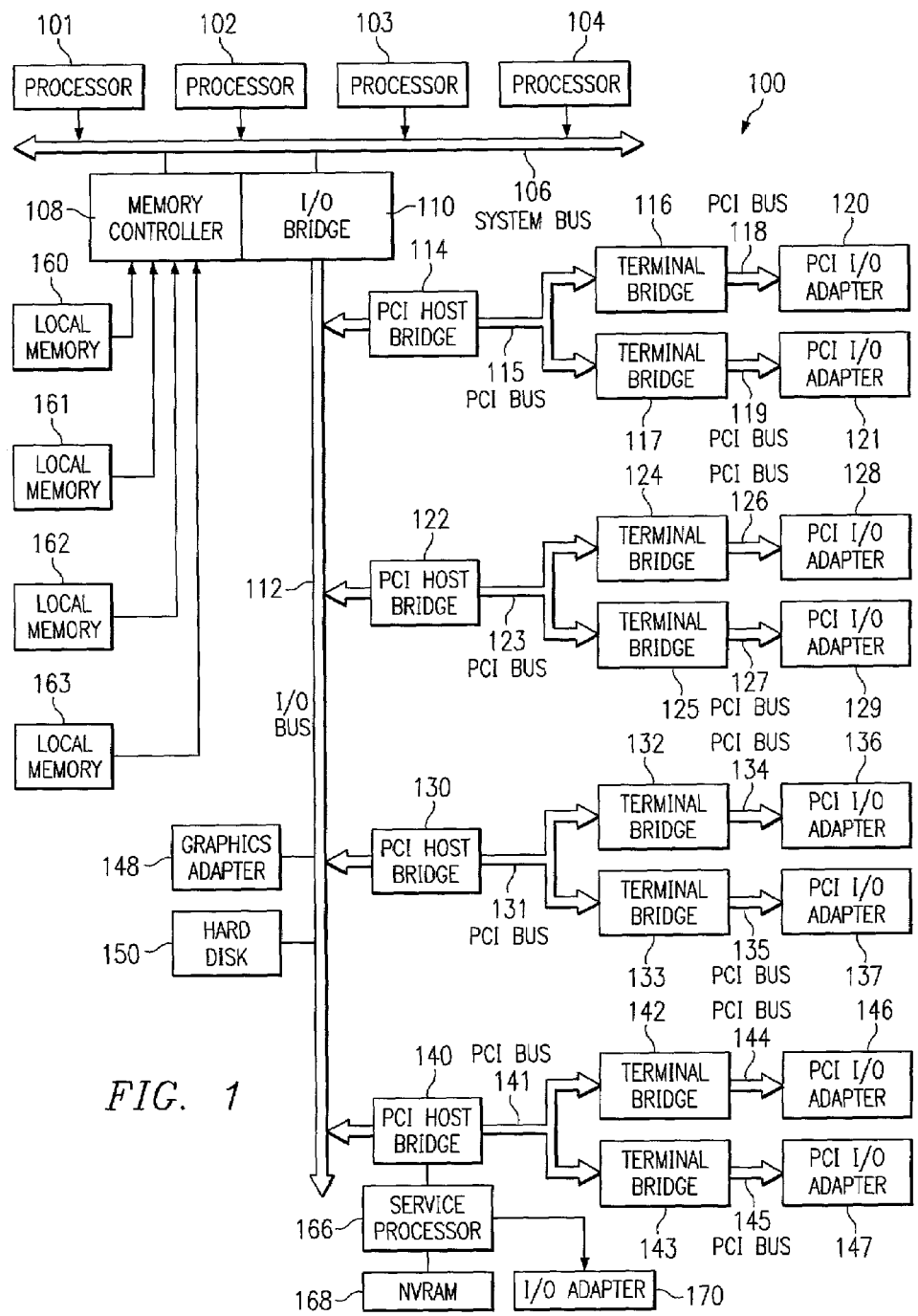
FIG. 1 depicts a block diagram of a data processing system according to an embodiment of the present invention.

With reference to the figures, in particular, FIG. 1 depicts a block diagram of a data processing system ("DPS") according to an embodiment of the present invention. In this example, data processing system 100 may be a symmetric multiprocessor ("SMP") system including a plurality of processors 101, 102, 103, and 104 connected to system bus 106. For example, data processing system 100 may be an IBM eServer pSeries (formerly known as RS/6000), a product of International Business Machines Corporation in Armonk, N.Y. Alternatively, a single processor system may be employed. Also connected to system bus 106 is a memory controller, 108 which provides an interface to a plurality of local memories 160–163. I/O bus bridge 110 is connected to system bus 106 and provides an interface to I/O bus 112. Memory controller 108 and I/O bus bridge 110 may be integrated as depicted.

Peripheral component interconnect (PCI) Host bridge 114 connected to I/O bus 112 provides an interface to PCI bus 115. A number of terminal bridges 116–117 may be connected to PCI bus 115. Typical PCI bus implementations will support four terminal bridges for providing expansion slots or add-in connectors. Each of terminal bridges 116–117 is connected to a PCI I/O adapter 120–121 through PCI Bus 118–119. Each I/O adapter 120–121 provides an interface between data processing system 100 and input/output devices such as, for example, other network computers, which are clients to server 100.

Additional PCI host bridges 122, 130, and 140 provide interfaces for additional PCI buses 123, 131, and 141. Each of additional PCI buses 123, 131, and 141 are connected to a plurality of terminal bridges 124–125, 132–133, and 142–143, which are connected to a PCI I/O adapter 128–129, 136–137, and 146–147 by a PCI bus 126–127, 134–135, and 144–145. Thus, additional I/O devices, such as modems or network adapters may be supported through each of PCI I/O adapters 128–129, 136–137, and 146–147. In this manner, server 100 allows connections to multiple network computers. A memory mapped graphics adapter 148 and hard disk 150 may also be connected to I/O bus 112 as depicted, either directly or indirectly.

Those of ordinary skill in the art will appreciate that the hardware depicted in FIG. 1 may vary. For example, other peripheral devices, such as optical disk drives and the like, also may be used in addition to or in place of the hardware depicted. The depicted example is not meant to imply architectural limitations with respect to the present invention.

Figure 2:
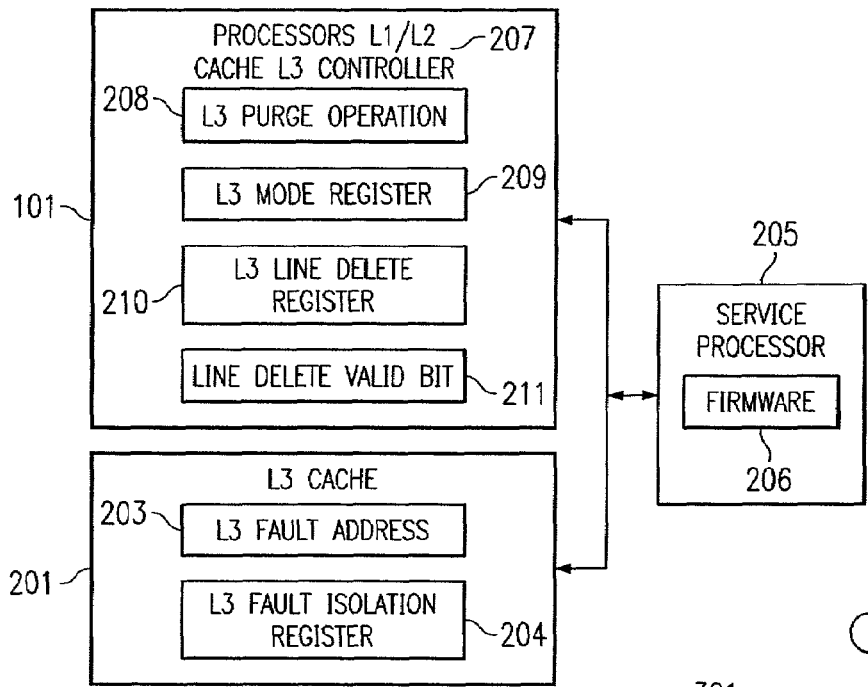
FIG. 2 is a block diagram of a processor with cache according to an embodiment of the present invention.

FIG. 2 depicts an example of a processor as described in FIG. 1 according to a preferred embodiment of the present invention. Processor 101 includes caches, such as a level 1 (L1) and a level 2 (L2) cache. A cache is a memory area close to or in the processor 101 that allows speedy access of information. It is used to speed up data transfer and is not part of the local memory 160–163. Instructions and data are transferred to the cache in blocks using a look-ahead algorithm. The more sequential the instructions in the routine being accessed, and the more sequential the order of the data being read, the more chance the next desired item will still be in the cache, and the greater improvement in performance.

In this example, the L1 and L2 cache are permanently located within processor 101. A level 3 ("L3") cache 201 exists outside of the processor, but is nearby. In this example, each L3 cache consists of 32 Mega-byte of storage. Additional L3 cache is required as more processors are added into system configuration. L3 cache improves system performance by minimizing the time required for the processor to read data from system memory. Each L3 cache line has 512 bytes. L3 cache hardware is designed with error correction code (ECC) to correct single bit error and with a system capable of operating with "N–1" cache line. "N" represents the total number of cache lines for a particular cache level in the system. An embodiment of the present invention may be implemented with a system running at "N–x" where "x" is a smaller value than "N".

The L3 cache includes supporting storages: L3 Fault Address storage 203 and L3 Fault Isolation storage 204. L3 Fault Address storage 203 contains the address of the physical location in the cache that is faulty. L3 Fault Isolation storage 204 contains captured error signatures including the single bit correctable error condition as to the cause of the error.

When single-bit error condition occurs in L3 cache array or line, the L3 cache hardware detects the error during a read or write cycle to the cache. L3 ECC hardware logic corrects the error. Information about the error is then recorded. A single-bit correctable error (CE) condition is set in L3 Fault Isolation storage 204. The address of the physical location of the error is saved in L3 Fault Address storage 203. Next, L3 cache hardware asserts "Attention" signal to service processor 205 to indicate an error condition. Processor 101 also includes L3 cache controller 207. L3 cache controller 207 contains L3 Purge Logic 208, L3 Mode storage 209, and L3 Line Delete register 210. The process utilizes these registers and logic in handling bit errors in the system.

The L3 cache line purge operation 208 ensures that if the data in L3 cache line is modified by any processor, the modified data is saved in system memory for future reference by other software program. Before the data is saved in memory, the single bit error is corrected by ECC logic when the data is accessed. The L3 cache line purge operation 208 also removes the soft error from L3 cache 201.

The present invention may be implemented as hardware or software, or a combination thereof. In a preferred embodiment, it is implemented from a firmware 206 of a service processor (SP) 205. SP firmware 206 is a set of computer instructions produced by computer hardware manufacturer to implement a specific computer function. In this case, the SP firmware 206 is written specifically for handling bit error. The firmware is executing processor instructions on the service processor. Those skilled in the art will understand that a set of computer instructions may be implemented from any processor in the system. The present invention is not limited to use by or in a service processor.

Figure 3:
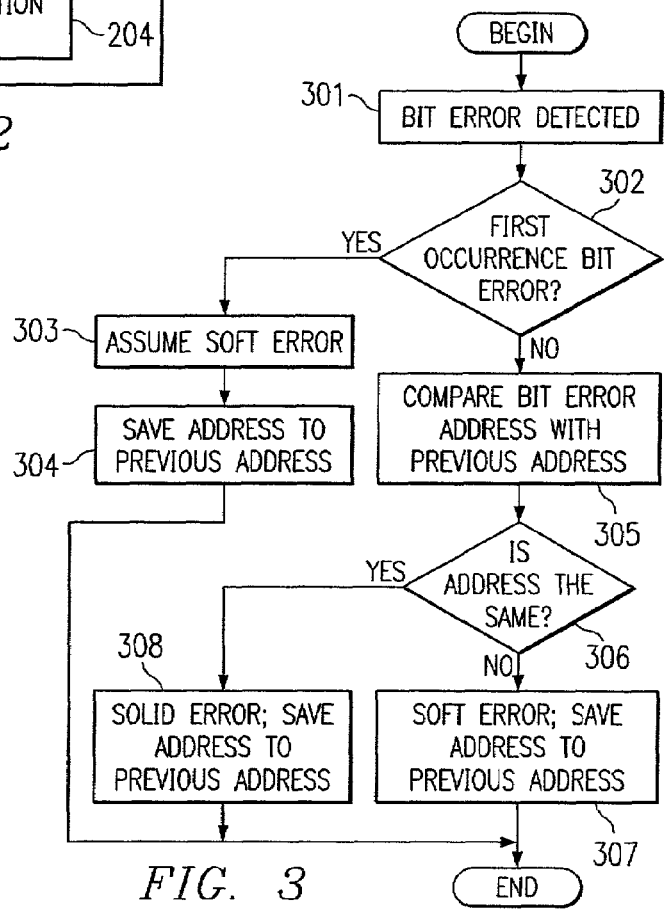
FIG. 3 depicts a flow chart of a process for distinguishing between soft and hard errors according to an embodiment of the present invention.

FIG. 3 depicts a flow chart of a process for distinguishing between soft and hard errors in the system. Initially, the system runs without any bit errors. There is no existing saved address for a non-existing bit error. The saved address corresponds to a prior physical location within the L3 cache of the data processing system that had the error. When a new error occurred and detected (step 301) for the first time in the system (step 302), the process receives an error indication (step 301). It checks for the source of the error. This first time error is assumed to be a soft error (step 303). The corresponding address of the error is saved (step 304) into a service processor storage location which is compared to latter address error and continually saves the latest address error. The soft error is handled accordingly.

When another error occurs, the process again receives an error indication, it checks for the source of the bit error (step 301). Then, it detects that an address is previously saved indicating that this is not a first time error (step 302). Next, it compares the error address to the previously saved address (step 305). A soft error is further detected if the addresses are not the same when compared (step 306). The address of this later bit error is then saved (step 307) ready to for another comparison when the next latter error occurs. The soft error is handled accordingly and is described in greater detail in FIG. 5.

When the process receives a bit error which turns out to be a hard error, it again checks for the source of the bit error (step 301). Then, it detects that an address is previously saved in the storage indicating that this is not a first time error (step 302). Next, it compares the error address to the previously saved address (step 305). The process detects a hard error if the compared addresses (step 306) are the same. The cache address of this bit error is then saved into the storage (step 308) ready to for another comparison when the next error occurs. The hard error is then handled accordingly as first or second hard error which is described in FIG. 4 and FIG. 5.

FIG. 4 is a flowchart generally outlining a process for handling cache with multiple single-bit errors of the present invention. As shown in FIG. 4, the process starts with the receipt of an attention to an error condition (step 402). The error condition for detection and correction includes bit errors. These bit errors include soft errors and hard errors. Next, the process determines the type of error conditions, soft error, serviceable hard, or last allowable hard error (step 404). If a soft error is detected, error is handled by a cache line purge operation (step 406).

If a serviceable hard error is detected, it is serviced accordingly step (408). The number of serviceable hard error that can be processed is predetermined by the capability of the L3 hardware logic design, the capability of the system to operate with "N–x" cache line, capability to exchange cache lines, or the combination thereof. Each time a hard error occurs, the number of hard error is incremented. In a preferred embodiment, the serviceable hard error that can be processed is one (1) because the system is designed with the capability to run with "N–1" cache line. The present invention may be implemented with a system running at "N–x" where "x" is a smaller value than "N" or by exchangeable cache line.

Exchangeable cache line is permissible when the system provides for spare cache line(s). A spare cache line is designed to replace a damaged one by exchanging or rerouting cache line to the spare while the damaged memory device becomes unused. A damaged one is replaced or exchanged without any system down time.

If a last allowable hard error is detected, the error is processed and the system continues to run with continuous error correction (step 410). Last allowable hard error is predetermined by the maximum number of serviceable hard error plus one. Last allowable hard error constitutes the last bit error the can be handled without system down time. The part(s) to be replaced is determined and logged. An operator is scheduled to replace these parts before system down time.

FIG. 5 is an exemplary flowchart of a process for handling bit errors on a data processing system. The elements shown in FIG. 5 may be implemented as hardware, software, firmware or a combination thereof. The operation illustrated in FIG. 5 may be implemented as instructions in system firmware executing on a computer by one or more processors. In these examples, steps 501 through 510 are implemented as firmware executing computer instructions from a service processor supporting a computer system with errors in L3 cache.

The process begins when SP 205 receives an Attention signal (step 502). The operation checks for the source of Attention signal (step 503) or error information. Step 503 includes reading L3 Fault Isolation register 204 and L3 Fault Address register 203. Determining the cause of the Attention signal involves the reading and deciphering L3 Fault Isolation 204. Reading the L3 Fault Address register 203 determines the location or address of a single bit error in the cache.

Next, in step 504, the process decides whether the error condition is a soft error or a hard error. First, the current address of the error is compared with a previously saved address of another error. If there is no previously saved address or the compared addresses are not the same, then the error is assumed as a soft error because a single bit error is present in this address location for the first time. In step 505, the SP firmware 206 handles the soft error by saving the current address of error in its storage and performing a single L3 cache line purge operation 208 by utilizing hardware logic in L3 controller 207. Next, the cache line is marked available for future usage (step 511). The handling of the soft error is terminated. Throughout this process, data processing system 100 continues to run. However, if the compared addresses are the same, then a second occurrence of a single bit error in this address location is present (step 504). In accordance with the probability and statistic of projected soft error failure rate, the second occurrence of a single bit error in the same address location indicates that this is a hard single bit error condition as noted in step 506. The SP firmware 206 then reads the Line Delete Valid Bit 211 to determine whether a cache line delete operation has been performed (step 507) on this L3 slice. A slice is a sub-section of a cache. In this example, L3 cache 201 is logically divided into two slices, slice 0 and slice 1.

If Line Delete Valid Bit 211 designated for this L3 slice is equal 0, then a line has not been previously deleted. This condition indicates a first hard error or a single-bit hard error for this L3 slice (step 508). First, an L3 cache line delete operation (step 508) is performed. Thereafter, the system runs with "N–1" cache line (step 512) for this L3 slice. Only one cache line delete operation (step 508) can be performed for each L3 slice for this embodiment of the present invention. Cache line delete operation prevents (step 508) the L3 cache line with single-bit hard error from future usage by the system. The impact to the system performance is extremely small. After step 508, the handling of a first hard error is terminated. At which time, the system continues to run with "N–1" cache line. Line delete operations (step 508) include the following steps:

(1) setting the corresponding address value field in the L3 Line Delete register 210 to equal the L3 Fault Address 203 captured above preventing future usage of the deleted cache line;

(2) setting the mode field of the L3 Mode Register 209 to "cache line delete" mode;

(3) performing a single L3 cache line purge operation 208 by using hardware logic in L3 controller 207;

(4) setting the corresponding cache set value field in the L3 Line Delete register 210 to this cache set preventing the L3 controller from snooping new requests against this deleted cache line entry in this cache set; and (5) setting to 1 the Line Delete Valid Bit 211 for this L3 slice preventing another cache line delete operation on the L3 slice.

According to step 507, if Line Delete Valid Bit 211 designated for this L3 slice is equal to 1, a cache line has already been deleted and no further cache line delete operation for this L3 slice is possible since only one line delete operation can be performed for each L3 slice. The second hard error is then handled by logging and reporting the bit error to indicate that an L3 cache part replacement is required (step 509). Consequently, a service personnel has the opportunity to replace the defective part(s) before an occurrence of system down time. The system continues to run with continuous error correction by the ECC (step 510). Second single-bit hard error is a type of hard error that occurs on another address other than the address of the first hard error. More importantly, the system has handled distinctive bit errors occurring on distinct addresses, thereby preventing any system down time.

Thus, the present invention provides an improved method, an apparatus, and a set of computer-implemented instructions for handling cache with multiple single-bit hard errors. The mechanism of the present invention includes a routine or a process that handles accordingly a soft error, a first hard error and a second hard error in which the system will not have down time by logging and reporting the error for part replacement by a service personnel.

It is important to note that while the present invention has been described in the context L3 cache, those of ordinary skill in the art will appreciate that the processes of the present system are desirable for any memory system with ECC logic.

It also is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, a CD-ROM, and DVD-ROM; and transmission-type media, such as digital and analog communications links, and wired or wireless communications links using transmission forms, such as radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method in a data processing system for handling a bit error, the method comprising:
    identifying the bit error associated with a cache address;
    determining a type of the bit error, wherein the type is one of a soft error and a hard error, wherein the soft error is a temporary error condition and wherein the hard error is a permanent error condition with repeating single bit errors; and
    performing a cache line deletion operation on the line which contains the address in response to a determination that the type of the bit error is the hard error.

2. The method as recited in claim 1 wherein the identifying the bit error comprises:
    receiving a signal indicating that the bit error occurred;
    retrieving a bit error condition; and
    retrieving the cache address of the bit error.

3. The method as recited in claim 1 wherein the determining a type of the bit error comprises:
    comparing the cache address with an address saved in a previous address storage.

4. The method as recited in claim 3 in response to a first time occurrence of bit error in the system, the method further includes:
    detecting no address in the previous address storage;
    assuming the bit error to be the soft error; and
    saving the cache address into the previous address storage for latter bit error determination.

5. The method as recited in claim 3 further comprises:
    detecting that an address is saved in the previous address storage;
    determining that the cache address is not the same as the address saved in the previous address storage;
    identifying that the bit error is the soft error; and
    saving the cache address into the previous address storage for latter bit error determination.

6. The method as recited in claim 3 further comprises:
    detecting that an address saved in the previous address storage;
    determining that the cache address is the same as the address saved in the previous address storage;
    identifying that the bit error is a hard error; and
    saving the cache address into the previous address storage for latter bit error determination.

7. The method as recited in claim 6 wherein identifying the hard error further comprises:
    comparing a number of occurred hard error with a predetermined value of serviceable hard error; and
    detecting a serviceable hard error when the number of occurred hard error is less than or equal to the predetermined value.

8. The method as recited in claim 6 wherein identifying the hard error further comprises:
    comparing a number of occurred hard error with a predetermined value of last allowable hard error; and
    detecting a last allowable hard error when the number of occurred hard error is less than or equal to the predetermined value.

9. The method as recited in claim 1 wherein the performing the cache line deletion operation comprises:
    preventing a future use of the cache line;
    preventing a snooping request to observe data in the cache line;
    preventing another cache line delete in a corresponding slice;
    setting mode to line delete; and
    performing a purge operation.

10. The method as recited in claim 9 wherein the performing a purge operation step further comprises:
    saving a modified data on the cache line into memory; and
    removing the soft error from the cache line.

11. The method as recited in claim 9 wherein the preventing a future use step includes setting a corresponding address value field in a Line Delete register to equal a Fault Address register.

12. The method as recited in claim 9 wherein the preventing a snooping request step includes setting a value field in a Line Delete register.

13. The method as recited in claim 9 wherein the preventing another cache line delete step includes setting a line delete valid bit for the corresponding slice.

14. The method as recited in claim 1 wherein the performing the cache line deletion operation comprises the step of exchanging a damaged memory device with a spare memory device.

15. The method as recited in claim 1 wherein the system continues to run without down time.

16. The method as recited in claim 1 wherein the cache line deletion operation comprises the step of identifying the hard error to be a serviceable hard error.

17. The method as recited in claim 1 wherein performing the cache line deletion operation when the hard error is a first hard error.

18. The method as recited in claim 17 wherein identifying first hard error comprises:
    comparing the cache address with an address saved in a previous address storage;
    determining that the cache address is the same as the address saved in the previous address storage; and
    detecting the cache address has not been deleted.

19. A data processing system for handling a bit error, the system comprising:
  means for identifying the bit error associated with a cache address;
  means for determining a type of the bit error, wherein the type is one of a soft error and a hard error, wherein the soft error is a temporary error condition, and wherein the hard error is a permanent error condition with repeating single bit errors; and
  means for performing a cache line deletion operation on the cache address in response to a determination that the type of the bit error is the hard error.

20. The system as recited in claim 19 wherein the identifying the bit error comprises:
  means for receiving a signal indicating that the bit error occurred;
  means for retrieving a bit error condition; and
  means for retrieving the cache address of the bit error.

21. The system as recited in claim 19 wherein the determining a type of the bit error comprises:
  means for comparing the cache address with an address saved in a previous address storage.

22. The system as recited in claim 21 in response to a first time occurrence of any bit error, the system includes:
  means for detecting no address in the previous address storage;
  assuming the bit error to be the soft error; and
  saving the cache address into the previous address storage for latter bit error determination.

23. The system as recited in claim 21 further comprises:
  means for detecting that an address is saved in the previous address storage;
  means for determining that the cache address is not the same as the address saved in the previous address storage;
  means for identifying that the bit error is the soft error; and
  means for saving the cache address into the previous address storage for latter bit error determination.

24. The system as recited in claim 21 further comprises:
  means for detecting that an address saved in the previous address storage;
  means for determining that the cache address is the same as the address saved in the previous address storage;
  means for identifying that the bit error is a hard error; and
  means for saving the cache address into the previous address storage for latter bit error determination.

25. The system as recited in claim 24 wherein identifying the hard error further comprises:
  means for comparing a number of occurred hard error with a predetermined value of serviceable hard error; and
  means for detecting a serviceable hard error when the number of occurred hard error is less than or equal to the predetermined value.

26. The system as recited in claim 24 wherein identifying the hard error further comprises:
  means for comparing a number of occurred hard error with a predetermined value of last allowable hard error; and
  means for detecting a last allowable hard error when the number of occurred hard error is less than or equal to the predetermined value.

27. The system as recited in claim 19 wherein the performing the cache line deletion operation comprises:
  means for preventing a future use of the cache line;
  means for preventing a snooping request to observe data in the cache line;
  means for preventing another cache line delete in a corresponding slice;
  means for setting mode to cache line delete; and
  means for performing a purge operation.

28. The system as recited in claim 27 wherein a purge operation further comprises:
  means for saving a modified data on the cache line into memory; and
  means for removing the soft error from the cache line.

29. The system as recited in claim 27 wherein means for the preventing a future use includes means for setting a corresponding address value field in a Line Delete register to equal a Fault Address register.

30. The system as recited in claim 27 wherein means for the preventing a snooping request includes means for setting a value field in a Line Delete register.

31. The system as recited in claim 27 wherein means for the preventing another cache line delete includes means for setting a line delete valid bit for the corresponding slice.

32. The system as recited in claim 19 wherein means for the performing the cache line deletion operation comprises means for exchanging a damaged memory device with a spare memory device.

33. The system as recited in claim 19 wherein the system continues to run without down time.

34. The system as recited in claim 19 wherein the cache line deletion operation comprises means for identifying the hard error to be a serviceable hard error.

35. The system as recited in claim 19 wherein the cache line deletion operation performs when the hard error is a first hard error.

36. The system as recited in claim 35 wherein means for identifying first hard error comprises:
  means for comparing the cache address with an address saved in a previous address storage;
  means for determining that the cache address is the same as the address saved in the previous address storage; and
  means for detecting the cache address has not been deleted.

37. A computer program product in a data processing system for handling a bit error, the product comprising:
  instruction means for identifying the bit error associated with a cache address;
  instruction means for determining a type of the bit error, wherein the type is one of a soft error and a hard error, wherein the soft error is a temporary error condition and wherein the hard error is a permanent error condition with repeating single bit errors; and
  instruction means for performing a cache line deletion operation on the cache address in response to a determination that the type of the bit error is the hard error.

38. The product as recited in claim 37 wherein the identifying the bit error comprises:
  instruction means for receiving a signal indicating that the bit error occurred;
  instruction means for retrieving a bit error condition; and
  instruction means for retrieving the cache address of the bit error.

39. The product as recited in claim 37 wherein the type of the bit error comprises:

instruction means for comparing the cache address with an address saved in a previous address storage.

40. The product as recited in claim 39 in response to a first time occurrence of any bit error, the product includes:
   instruction means for detecting no address in the previous address storage;
   instruction means for assuming the bit error to be the soft error; and
   instruction means for saving the cache address into the previous address storage for latter bit error determination.

41. The product as recited in claim 39 further comprises:
   instruction means for detecting that an address is saved in the previous address storage;
   instruction means for determining that the cache address is not the same as the address saved in the previous address storage;
   instruction means for identifying that the bit error is the soft error; and
   instruction means for saving the cache address into the previous address storage for latter bit error determination.

42. The product as recited in claim 39 further comprises:
   instruction means for detecting that an address saved in the previous address storage;
   instruction means for determining that the cache address is the same as the address saved in the previous address storage;
   instruction means for identifying that the bit error is a hard error; and
   saving the cache address into the previous address storage for latter bit error determination.

43. The product as recited in claim 42 wherein instruction means for identifying the hard error further comprises:
   instruction means for comparing a number of occurred hard error with a predetermined value of serviceable hard error; and
   instruction means for detecting a serviceable hard error when the number of occurred hard error is less than or equal to the predetermined value.

44. The product as recited in claim 42 wherein instruction means for identifying the hard error further comprises:
   instruction means for comparing a number of occurred hard error with a predetermined value of last allowable hard error; and
   instruction means for detecting a last allowable hard error when the number of occurred hard error is less than or equal to the predetermined value.

45. The product as recited in claim 37 wherein instruction means for the performing the cache line deletion operation comprises:
   instruction means for preventing a future use of the cache line;
   instruction means for preventing a snooping request to observe data in the cache line;
   instruction means for preventing another cache line delete in a corresponding slice;
   instruction means for setting mode to line delete; and
   instruction means for performing a purge operation.

46. The product as recited in claim 45 wherein instruction means for the performing a purge operation step further comprises:
   instruction means for saving a modified data on the cache line into memory; and
   instruction means for removing the soft error from the cache line.

47. The product as recited in claim 45 wherein instruction means for the preventing a future use includes instruction means for setting a corresponding address value field in a Line Delete register to equal a Fault Address register.

48. The product as recited in claim 45 wherein instruction means for the preventing a snooping request includes instruction means for setting a value field in Line Delete register.

49. The product as recited in claim 45 wherein instruction means for the preventing another cache line delete includes instruction means for setting a line delete valid bit for the corresponding slice.

50. The product as recited in claim 37 wherein the performing the cache line deletion operation comprises the step of exchanging a damaged memory device with a spare memory device.

51. The product as recited in claim 37 wherein the system continues to run without down time.

52. The product as recited in claim 37 wherein the cache line deletion operation comprises instruction means for identifying the hard error to be a serviceable hard error.

53. The product as recited in claim 37 wherein instruction means for performing the cache line deletion operation when the hard error is a first hard error.

54. The product as recited in claim 53 wherein instruction means for identifying first hard error comprises:
   instruction means for comparing the cache address with an address saved in a previous address storage;
   instruction means for determining that the cache address is the same as the address saved in the previous address storage; and
   instruction means for detecting the cache address has not been deleted.

55. A method in a data processing system for handling a bit error, the method comprising:
   identifying the bit error associated with a cache address;
   determining if the bit error is a last allowable hard error, wherein the last allowable hard error indicates a last bit error that can be handled without system down time;
   responsive to determining that the bit error is a last allowable hard error, identifying a defective part; and
   logging for replacement of the defective part.

56. The method as recited in claim 55, wherein detecting the last allowable hard error further comprises:
   detecting that an address saved in the previous address storage;
   comparing the cache address with an address saved in a previous address storage;
   determining that the cache address is the same as the address saved in the previous address storage;
   identifying that the bit error is a hard error;
   incrementing a number of occurred hard error; and
   saving the cache address into the previous address storage for latter bit error determination.

57. The method as recited in claim 56 wherein detecting the last allowable hard error further comprises:
   comparing the number of occurred hard error with a predetermined value of last allowable error; and
   detecting that the number of occurred hard error is equal to the predetermined value.

58. The method as recited in claim 55 wherein the system continues to run without down time.

59. The method as recited in claim 55 wherein the last allowable hard error is a second hard error.

60. The method as recited in claim 59 wherein identifying the second hard error comprises:

comparing the cache address with an address saved in a previous address storage;
determining that the cache address is the same as the address saved in the previous address storage; and
detecting the cache address has been deleted.

61. A method in a data processing system for handling a bit error, the method comprising:
identifying the bit error associated with a cache address;
determining a type of the bit error, wherein the type is one of a soft error, a serviceable hard error, and a last allowable hard error;
performing a purge on the cache address in response to a determination that the type of the bit error is the soft error;
performing a cache line deletion operation on the cache address in response to a determination that the type of the bit error is the serviceable hard bit error; and
logging for part replacement in response to a determination that the type of the bit error is the last allowable hard bit error.

62. A method in a data processing system for handling a bit error of a memory system, the method comprising:
identifying the bit error associated with a memory address;
determining a type of the bit error, wherein the type is one of a soft error and a hard error, wherein the soft error is a temporary error condition and wherein the hard error is a permanent error condition with repeating single bit errors; and
performing a line deletion operation on the memory address in response to a determination that the type of the bit error is the hard error.

63. The method as recited in claim 62 wherein the identifying the bit error comprises:
receiving a signal indicating that the bit error occurred;
retrieving a bit error condition; and
retrieving the memory address of the bit error.

64. The method as recited in claim 62 wherein the determining a type of the bit error comprises:
comparing the memory address with an address saved in a previous address storage.

65. The method as recited in claim 64 in response to a first time occurrence of bit error in the system, the method further includes:
detecting no address in the previous address storage;
assuming the bit error to be the soft error; and
saving the memory address into the previous address storage for latter bit error determination.

66. The method as recited in claim 64 further comprises:
detecting that an address is saved in the previous address storage;
determining that the memory address is not the same as the address saved in the previous address storage;
identifying that the bit error is the soft error; and
saving the memory address into the previous address storage for latter bit error determination.

67. The method as recited in claim 64 further comprises:
detecting that an address saved in the previous address storage;
determining that the memory address is the same as the address saved in the previous address storage;
identifying that the bit error is a hard error; and
saving the memory address into the previous address storage for latter bit error determination.

68. The method as recited in claim 67 wherein identifying the hard error further comprises:
comparing a number of occurred hard error with a predetermined value of serviceable hard error; and
detecting a serviceable hard error when the number of occurred hard error is less than or equal to the predetermined value.

69. The method as recited in claim 68 wherein identifying first hard error comprises:
comparing the memory address with an address saved in a previous address storage;
determining that the memory address is the same as the address saved in the previous address storage; and
detecting the memory address has not been deleted.

70. The method as recited in claim 67 wherein identifying the hard error further comprises:
comparing a number of occurred hard error with a predetermined value of last allowable hard error; and
detecting a last allowable hard error when the number of occurred hard error is less than or equal to the predetermined value.

71. The method as recited in claim 62 wherein the performing the line deletion operation comprises:
preventing a future use of the line;
preventing a snooping request to use the line;
preventing another line delete in a corresponding slice;
setting mode to line delete; and
performing a purge operation.

72. The method as recited in claim 71 wherein the performing a purge operation step further comprises:
saving a modified data on the line into memory; and
removing the soft error from the line.

73. The method as recited in claim 71 wherein the preventing a future use step includes setting a corresponding address value field in a Line Delete storage to equal a Fault Address storage.

74. The method as recited in claim 71 wherein the preventing a snooping request step includes setting a value field in a Line Delete storage.

75. The method as recited in claim 71 wherein the preventing another line delete step includes setting a line delete valid bit for the corresponding slice.

76. The method as recited in claim 62 wherein the performing the line deletion operation comprises the step of exchanging a damaged memory device with a spare memory device.

77. The method as recited in claim 62 wherein the system continues to run without down time.

78. The method as recited in claim 62 wherein the line deletion operation comprises the step of identifying the hard error to be a serviceable hard error.

79. The method as recited in claim 62 wherein performing the line deletion operation when the hard error is a first hard error.

80. A method in a data processing system for handling a bit error, the method comprising:
identifying the bit error associated with a memory address;
determining a type of the bit error, wherein the type is one of a soft error, a serviceable hard error, and a last allowable hard error;
performing a purge on the memory address in response to a determination that the type of the bit error is the soft error;
performing a line deletion operation on the memory address in response to a determination that the type of the bit error is the serviceable hard bit error; and
logging for part replacement in response to a determination that the type of the bit error is the last allowable hard bit error.

* * * * *